United States Patent
Azar

(10) Patent No.: US 6,890,390 B2
(45) Date of Patent: May 10, 2005

(54) METHOD FOR ULTRASONIC CLEANING USING PHASED TRANSDUCER ARRAYS

(76) Inventor: Lawrence Azar, 200 Harbor Dr., #1201, San Diego, CA (US) 92101

( * ) Notice: Subject to any disclaimer, the term of this patent is extended or adjusted under 35 U.S.C. 154(b) by 87 days.

(21) Appl. No.: 10/444,679

(22) Filed: May 22, 2003

(65) Prior Publication Data

US 2004/0231697 A1 Nov. 25, 2004

(51) Int. Cl.[7] ............................................. B08B 3/12
(52) U.S. Cl. ........................ 134/1; 134/1.3; 134/18; 134/113; 134/184; 134/902; 310/314; 310/317; 310/320; 73/1.02
(58) Field of Search ..................... 134/1, 1.3, 18, 134/113, 184, 902; 310/314, 317, 320; 73/1.02

(56) References Cited

U.S. PATENT DOCUMENTS

| | | | |
|---|---|---|---|
| 3,565,062 A | 2/1971 | Kuris | |
| 3,589,363 A | 6/1971 | Banko et al. | |
| 3,645,255 A | 2/1972 | Robinson | |
| 4,169,984 A | 10/1979 | Parisi | |
| 4,308,229 A | 12/1981 | Voit | |
| 4,425,204 A | 1/1984 | McLaughlin | |
| 4,517,159 A | 5/1985 | Karlson | |
| 4,808,153 A | 2/1989 | Parisi | |
| 6,450,184 B1 * | 9/2002 | Azar | 134/57 R |
| 6,822,372 B2 * | 11/2004 | Puskas | 310/317 |
| 2002/0043893 A1 * | 4/2002 | Puskas | 310/316.01 |
| 2004/0182414 A1 * | 9/2004 | Puskas | 134/1 |

* cited by examiner

Primary Examiner—Zeinab E. El-Arini
(74) Attorney, Agent, or Firm—Nydegger & Associates

(57) ABSTRACT

A method for cleaning a substrate surface using ultrasonic energy includes an array of 'N' transducer elements. Electrical signals, $S_n$, having signal parameters including a voltage, $V_N$, and phase, $\theta_N$, are provided to drive each transducer element and generate respective ultrasonic waves. A computer sub-system is used to control the signal parameters to establish a substantially uniform cavitation energy at a plurality of locations on the substrate surface. The signal parameters can be established to focus or steer the ultrasonic energy from the array to each location. To calculate the electrical signal parameters, the computer sub-system can use some or all of the following as inputs; the arrangement and inter-element spacing of the transducer elements, characteristics of the fluid medium, and the coordinates of the locations requiring cleaning.

12 Claims, 9 Drawing Sheets

METHOD FOR ULTRASONIC CLEANING USING PHASED TRANSDUCER ARRAYS

FIELD OF THE INVENTION

The present invention pertains generally to ultrasonics cleaning. More particularly, the present invention pertains to ultrasonic cleaning using phased transducer arrays. The present invention is particularly, but not exclusively, useful for establishing a target pressure on a substrate surface using directed ultrasonic energy to efficiently clean the surface.

BACKGROUND OF THE INVENTION

Ultrasonic cleaning systems are well known and are currently used in a wide variety of applications to clean various types of substrate surfaces (e.g. surfaces on semiconductor wafers, component parts with complex surface geometries, electronic devices, etc). In a typical arrangement, a cleaning system includes a tank that holds a fluid medium such as an aqueous solution. The aqueous solution generally includes additives such as surfactants and detergents that enhance the cleaning performance of the system.

In a simple ultrasonic system, a transducer which is typically an electrostrictive or a magnetostrictive transducer, is provided to generate high frequency vibrations in the cleaning tank in response to an electrical signal input. As used herein, the term 'ultrasonic' and its derivatives means sonic waves having a wave frequency above approximately 15 kHz and includes both the traditional ultrasonic spectrum which extends in frequency from approximately 15 kHz to 400 kHz and the more recently used megasonic spectrum which extends in frequency from about 500 kHz to about 3 MHz.

Once generated, the transducer vibrations propagate through the fluid medium in the cleaning tank until they reach the substrate to be cleaned. More specifically, the vibrations generate an ultrasonic wave within the fluid medium wherein each point along the wave oscillates within a pressure range between a pressure maximum (compression) and a pressure minimum (rarefaction). When the pressure minimum is below the vapor pressure of the fluid medium, the ultrasonic wave can cause cavitation bubbles to form in the fluid medium.

As a result of the time-varying pressure field created by the transducer vibrations, cavitation bubbles form at sites in the fluid medium when the site pressure drops below the vapor pressure of the fluid and approaches the pressure minimum. These cavitation bubbles subsequently collapse (i.e. implode) as the site transitions from the pressure minimum to the pressure maximum. During bubble implosion, surrounding fluid quickly flows to fill the void created by the collapsing bubble and this flow results in an intense shock wave which is uniquely suited to substrate surface cleaning. Specifically, bubble implosions that occur near or at the substrate surface will generate shock waves that can dislodge contaminants and other soils from the substrate surface. The implosion of the many bubbles near the substrate surface over time results in an intense scrubbing action that is very efficient in cleaning devices such as memory disks, semiconductor wafers, LCD devices and the like.

In almost all cleaning applications, it is important to control the cavitation energy. If an insufficient amount of cavitation energy is provided, undesirably long process time may be required to obtain a desired level of cleaning, or in some cases, a desired level of surface cleaning may not be achievable. On the other hand, excessive cavitation energy near a substrate having delicate surfaces or components can cause substrate damage. Examples of substrate damage include the formation of pits and/or craters on the substrate surface. One factor that affects the size of the cavitation bubbles and the corresponding cavitation energy is the frequency of the ultrasonic wave. Specifically, at higher wave frequencies there is less time for the bubble to grow. The result is smaller bubbles and a corresponding reduction in cavitation energy.

Another factor that affects cavitation energy is the intensity of the ultrasonic wave (i.e. wave amplitude) produced by the transducer(s). In greater detail, higher wave intensities cause each point along the wave to oscillate over a larger pressure range (between rarefaction and compression), which in turn, produces larger cavitation bubbles and larger cavitation energy. Thus, there is a direct correlation between the intensity of the ultrasonic wave, the pressure range that the fluid medium oscillates between, and cavitation energy. The pressure range that the fluid medium oscillates between can be characterized as having a pressure peak relative to the ambient pressure in the fluid medium when ultrasonic waves are absent. Accordingly, pressure peak can be used as a suitable measure of cavitation energy. One additional factor that should be considered is the fact that the intensity of an ultrasonic wave will decrease as the wave propagates through the fluid medium. Thus, cavitation energy is generally a function of distance from the transducer. As a consequence, portions of a substrate that are located at different distances from an ultrasonic energy source will experience different levels of cavitation energy. As a result, it has been somewhat challenging to uniformly clean a substrate having a complex surface geometry. As used herein, the term 'complex surface geometry' means any surface that is not substantially flat.

With the above in mind, an array of transducer elements can be used to direct ultrasonic energy to a localized area on a substrate surface. Specifically, the phases of the electrical signals driving each transducer element can be selectively delayed to cause a localized area on the substrate surface to receive relatively intense ultrasonic energy while surrounding areas on the substrate surface receive significantly less ultrasonic energy. The localized region of intense ultrasonic energy is a result of interference (constructive and destructive) between the ultrasonic waves generated by the transducer elements. By adjusting the phase delays over time, the region of intense ultrasonic energy can be electronically scanned through space. For example, U.S. Pat. No. 6,554,003, which issued to Birang et al. on Apr. 29, 2003, discloses a transducer array and a method for adjusting the energy waves produced by each transducer to scan an 'energy wave maximum' along a surface of a thin disc. However, the present invention recognizes that merely scanning an 'energy wave maximum' along a surface does not necessarily ensure that each point on the surface experiences the same cavitation energy. For example, portions of a substrate that are located at different distances from the transducer will experience different levels of cavitation energy because the intensity of an ultrasonic wave decreases as it propagates through the fluid medium. Also, and importantly, portions of a substrate that are located at different angles from the transducer will experience different levels of cavitation energy because the intensity of an ultrasonic wave is a function of steering angle (or focusing angle). Thus, an undesirable variation in cavitation energy is present when an "energy wave maximum" is scanned along a flat surface, and it is to be appreciated that an even greater variation in cavitation energy occurs for substrates having complex surface geometries that are cleaned by scanning an "energy wave maximum" along the substrate surface.

In light of the above, it is an object of the present invention to provide systems and methods suitable for the purposes of directing ultrasonic energy to establish a target pressure peak and thus a target cavitation energy at a location on a substrate surface to efficiently clean the surface. It is another object of the present invention to provide systems and methods for uniformly cleaning a substrate surface including the surface of a substrate having a complex surface geometry.

SUMMARY OF THE INVENTION

The present invention is directed to systems and methods for cleaning the surface of a substrate using ultrasonic energy. The cleaning system includes a plurality of "N" transducer elements that are arranged in an array. Typical arrangements can include a linear array of transducer elements, a matrix array (e.g. an n×m array) of transducer elements or an irregular array of elements. A plurality of drivers is provided, with each driver connected to a respective transducer element. Each driver generates an electrical signal, $S_N$, which is input to a respective transducer element to drive the respective element. Each electrical signal, $S_N$, can be characterized as having signal parameters including a voltage, $V_N$, and phase, $\theta_N$. Each transducer element vibrates in response to its respective input electrical signal, $S_N$, and thereby generates a respective ultrasonic wave.

The cleaning system further includes a fluid medium that is interposed between the array and the substrate surface. The fluid medium is provided to transmit the ultrasonic waves generated by the array to the substrate surface. In the fluid medium, the ultrasonic waves generated by each transducer element interact (i.e. interfere constructively or destructively) to produce a time-varying pressure field in the fluid medium.

A computer sub-system is provided to control the electrical signal parameters including the voltage, $V_N$, and phase, $\theta_N$, that are input to each transducer element. Specifically, the signal parameters are controlled to establish a substantially uniform cavitation energy at a plurality of pre-selected locations on the substrate surface. In most cases, the pre-selected locations combine to form a contiguous area on the substrate surface. Thus, uniform cleaning can be achieved over a contiguous area. As indicated above, the cavitation energy at a location is proportional to the range of pressure oscillation (between rarefaction and compression) at the location. This pressure range, in turn, can be characterized as having a pressure peak.

In a first implementation of the cleaning system, the coordinates of a first location on the substrate surface (relative to the array) are first identified. Next, the computer sub-system determines the electrical signal parameters including the voltage, $V_N$, and phase, $\theta_N$, required to obtain a pre-selected (i.e. target) pressure peak at the first location. For example, the signal parameters can be established to focus ultrasonic energy from the array to the first location. This is typically done when the first location is positioned in the near field of the array.

Alternatively, the signal parameters can be established to steer ultrasonic energy from the array to the first location. This is typically done when the first location is positioned in the far field of the array. To calculate the electrical signal parameters, the computer sub-system can use some or all of the following as inputs: the number, type, arrangement and inter-element spacing of the transducer elements, the characteristics of the fluid medium, and the coordinates of the first location. This process is then repeated for a second location which is typically adjacent to the first location, a third location adjacent to the second and so on. Thus, the directed ultrasonic energy (e.g. focused or steered) is 'electronically scanned' from location to location while maintaining a uniform cavitation energy.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION OF THE PREFERRED EMBODIMENTS

Figure 1:
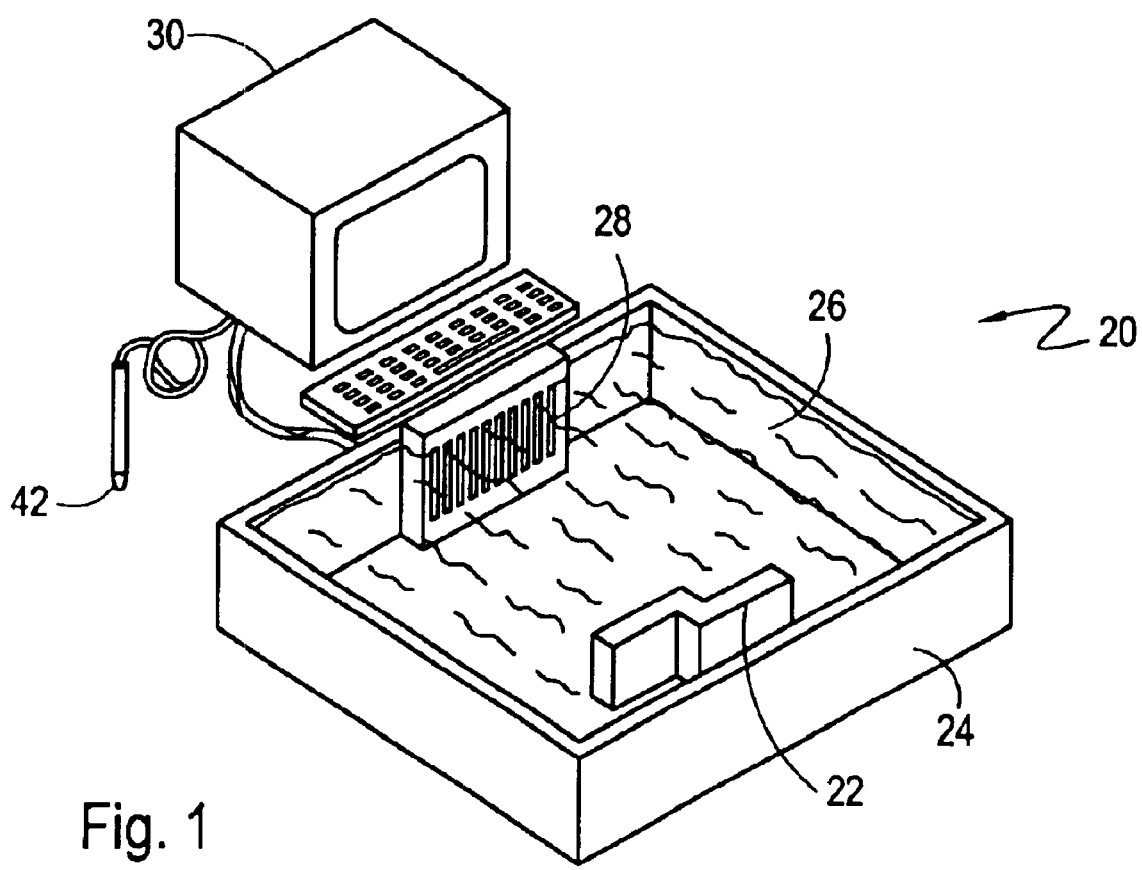
FIG. 1 is a perspective view of a ultrasonic cleaning system.

Referring to FIG. 1, a cleaning system is shown and generally designated 20. Functionally, the system 20 is provided to clean a substrate 22 using ultrasonic energy. As shown in FIG. 1, the system 20 includes a container 24 that holds a fluid medium 26 within which part or all of the substrate 22 is immersed. The system 20 further includes a multi-element transducer array 28 that is immersed in the fluid medium 26 and electrically connected to a computer sub-system 30.

Figure 2:
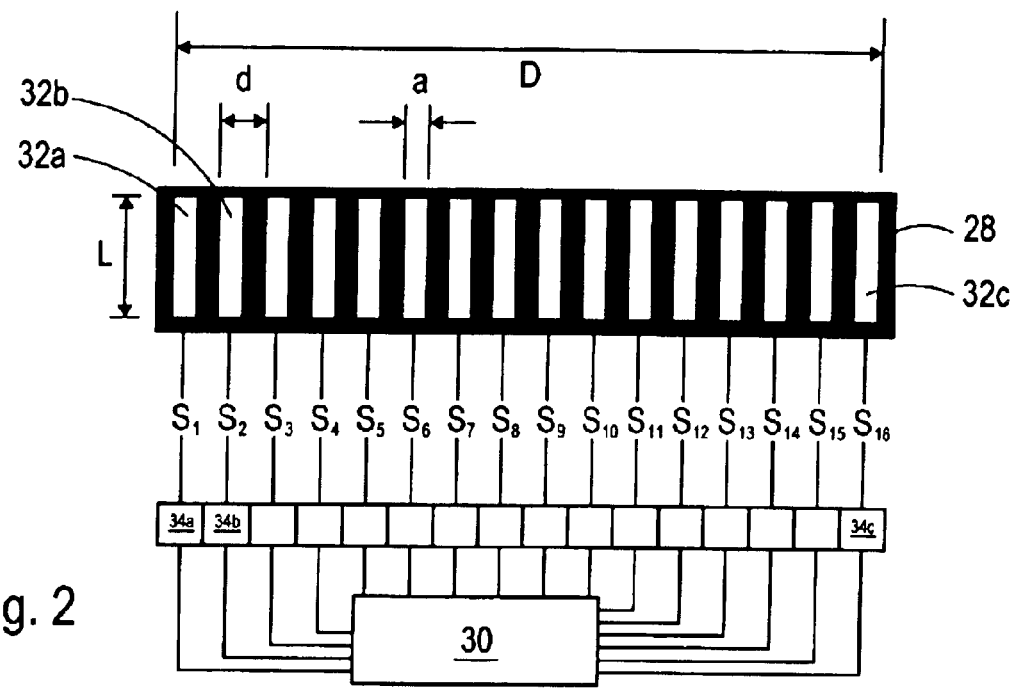
FIG. 2 is a schematic diagram of a linear array of transducer elements.
Figure 3:
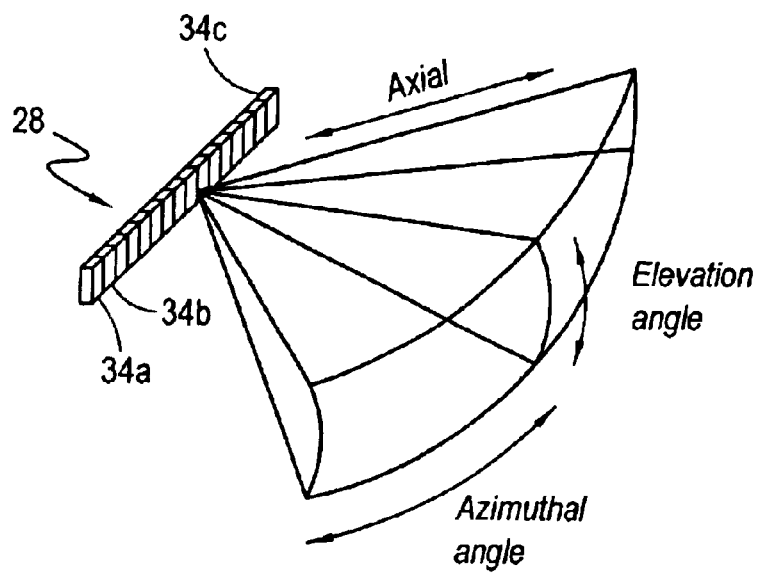
FIG. 3 is a simplified, perspective view of a linear array of transducer elements and a typical field of view for the linear array.

FIG. 2 shows a linear transducer array 28 having sixteen (N=16) transducer elements 32, of which exemplary transducer elements 32a–c have been labeled with reference numerals. As shown in FIG. 2, parameters of the array 28 include the width (a) of each element 32, the center-to-center inter-element spacing (d), the total aperture dimension (D), and the elevation dimension (L). As detailed further below, the array 28 can be used to produce directed ultrasonic energy. As used herein, the term 'directed ultrasonic energy' and its derivatives includes, but is not necessarily limited to focused ultrasonic energy and steered ultrasonic energy. With this in mind, FIG. 3 shows the linear array geometry and a typical field of view. Specifically, FIG. 3 illustrates the axial direction, azimuthal angle and the elevation angle relative to the array 28.

As shown in FIG. 2, the system 20 can include a plurality of drivers 34, of which exemplary drivers 34a–c have been labeled with reference numerals. As shown, each driver 34 is connected to a respective transducer element 32 and generates an electrical signal, $S_1$–$S_{16}$, which is input to a respective transducer element 32 to drive the respective element 32. Each electrical signal, $S_N$, can be characterized as having signal parameters including a voltage, $V_N$, and phase, $\theta_N$. Typically, a common frequency (f) is used for each electrical signal, $S_1$–$S_{16}$. Each transducer element 32 vibrates in response to its respective input electrical signal, $S_N$, and thereby generates a respective ultrasonic wave in the fluid medium 26 (fluid medium 26 shown in FIG. 1).

Figure 4:
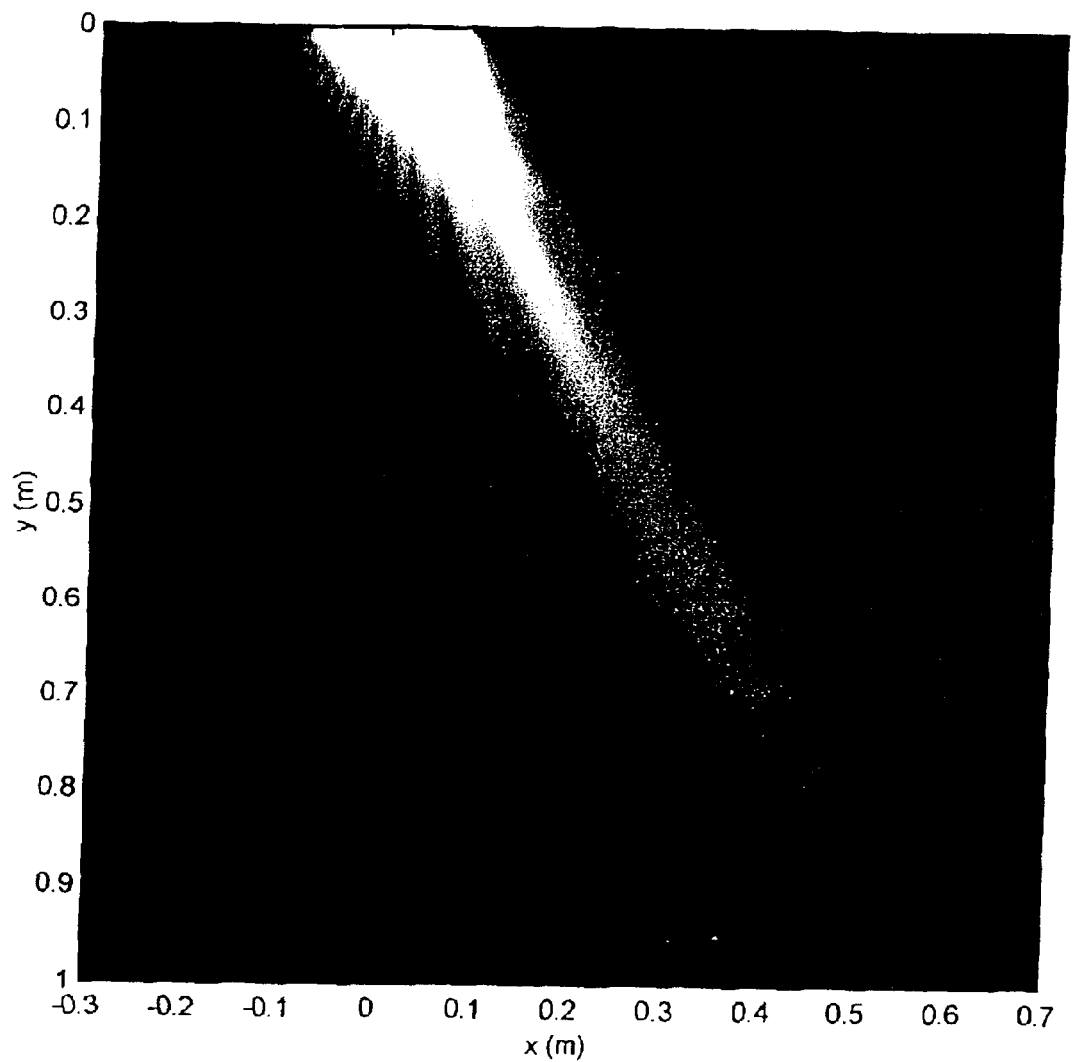
FIG. 4 is a graph showing a simulated pressure profile for an array that is steered to a location.

For the system 20, the electrical signals, $S_N$, can be used to direct ultrasonic energy. Phase steering (see FIG. 4) can be accomplished by controlling the phase, $\theta_N$ of each transducer elements 32. The direction of the acoustic beam propagation may be reoriented to any azimuthal angle (see FIG. 3). The sound field in the fluid medium can be represented as Huyghen waves emitted from each element 32. All the individual wavefronts add to produce a maximum acoustic intensity along the desired direction. The constant inter-element delay for steering the ultrasonic field can be calculated by:

$$\Delta\tau_0 = d\sin\theta_s/c,$$

where $\Delta\sigma_0$ is the time delay between adjacent elements, d is the distance between elements, $\theta_s$ is the required steering angle, and c is the wave speed in the fluid medium. FIG. 4 shows a simulated numerical pressure profile of an array being steered at 30°. Specifically, FIG. 4 shows a trace of the waves propagated by each element 34, and demonstrates Huyghen's principle of wave interaction needed to steer the acoustic wavefronts.

Figure 5:
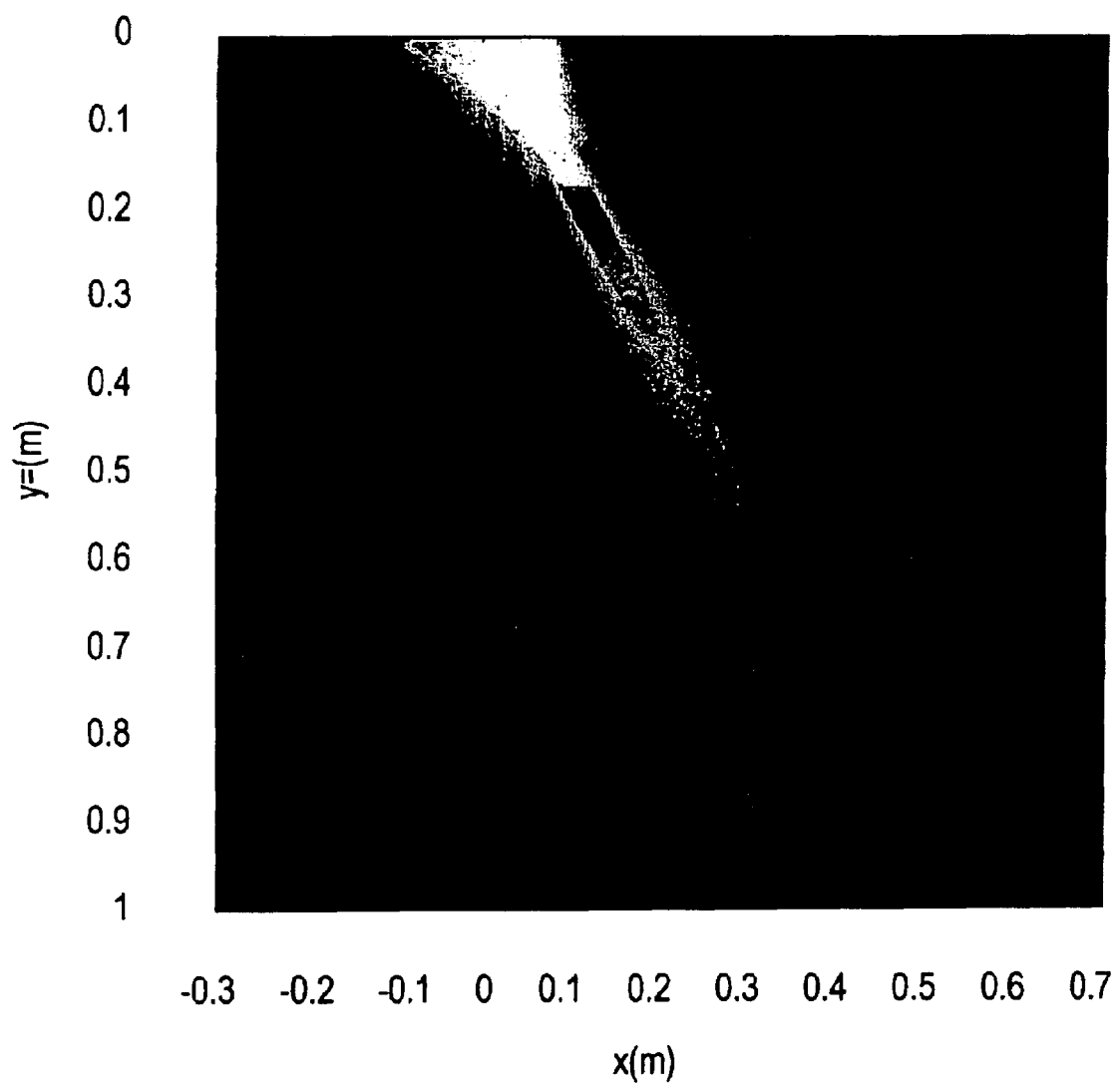
FIG. 5 is a graph showing a simulated pressure profile for an array that is steered to a location.

Alternatively, the system 20 can direct ultrasonic energy by focusing. Specifically, the electrical signals, $S_N$, can be used to control the phase, $\theta_N$ of each transducer elements 32 and thereby focus ultrasonic energy to a point in space (see FIG. 5). Focusing ultrasonic energy can be accomplished by combining a spherical timing relationship with a linear one to focus ultrasonic energy at a given range (from the array 28) and propagated at a specific azimuthal angle (see FIG. 3). The focusing delays for an array 28 having an odd number of elements 34 can be calculated using the formula:

$$\Delta t_n = \frac{F}{c}\left(1 - \left[1 + \left(\frac{nd}{F}\right)^2 - 2\frac{nd}{F}\sin\theta_s\right]^{1/2}\right) + t_0,$$

where $\Delta t_n$ is the required delay for the Nth element, F is the focal length, and $t_0$ is a constant to keep the delays positive. FIG. 5 demonstrates a numerical pressure profile of an array being focused 30° at a focal length of 10 cm.

In addition to the primary lobe, other lobes may exist due to constructive reinforcement of the Huyghen waves. These additional planes of constant phase are called grating lobes, and can be eliminated by having the inter-element spacing be less than $d_{max}$ where:

$$d_{max} = \frac{\lambda}{1 + \sin(\theta_s)_{max}} \frac{N-1}{N},$$

where $(\theta_s)_{max}$ is the desired maximum operating steering angle.

Figure 6:
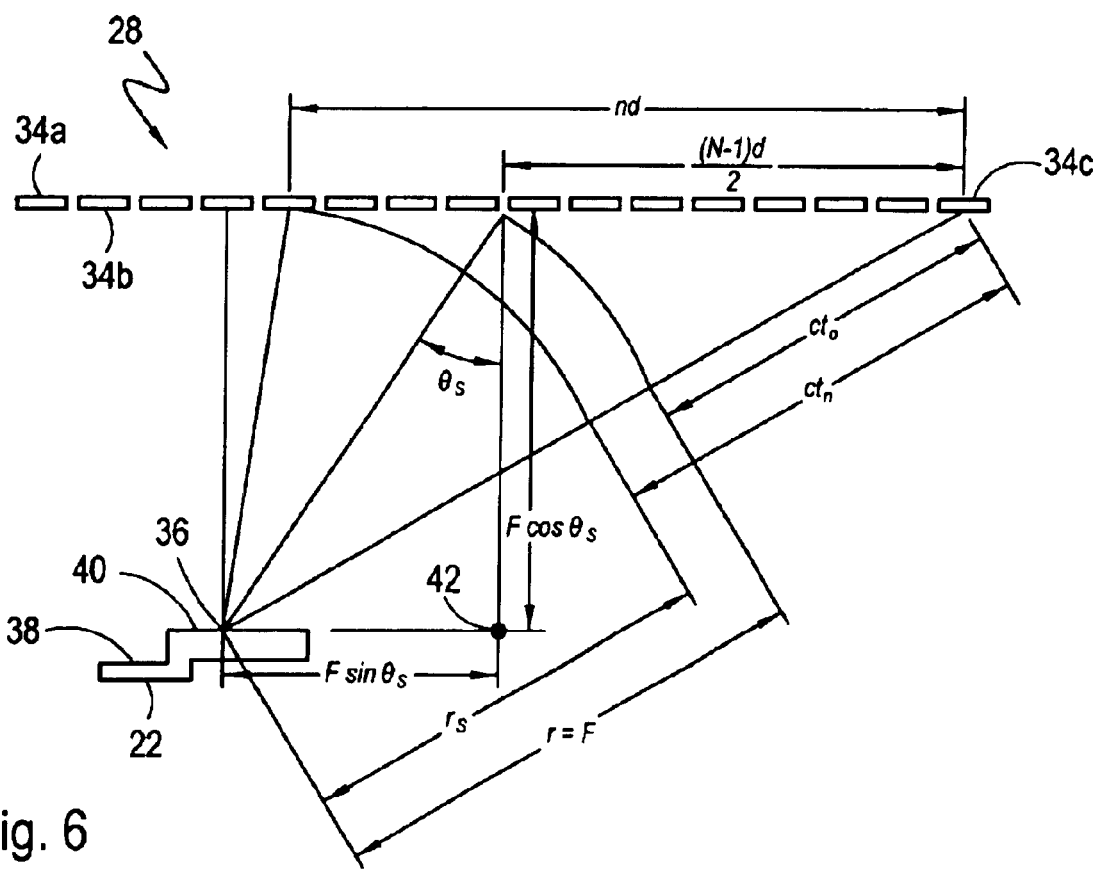
FIG. 6 is a schematic diagram of a linear array showing dimension and angles useful for calculating transducer element delays for focusing wherein the array can have an odd or even number of transducer elements.

With reference now to FIG. 6, the delays for focusing an array 28 to a first location 36 on the surface 38 of a substrate 22 wherein the array 28 can have any number of elements 34 (i.e. an odd or even number of elements) can be calculated as follows:

$$(F\cos\theta_s)^2 + \left[F\sin\theta_s - \left(nd - \frac{N-1}{2}d\right)\right]^2 = [F - (t_n - t_0)c]^2,$$

for the element n=0,1, . . . , N−1, where N is the total number of elements. Note that in FIG. 3, the first element (n=0) starts at the right hand side of the array. Solving for $t_n$, we obtain:

$$t_n = \frac{F}{c}\left\{1 - \left[1 + \left(\frac{d}{F}\left(n - \frac{N-1}{2}\right)\right)^2 - 2\sin\theta_s\frac{d}{F}\left(n - \frac{N-1}{2}\right)\right]^{1/2}\right\} + t_0. \quad \text{Eq. (1)}$$

The constant $t_0$ can be determined by substituting the boundary condition ($t_n$=0 for n=0) into Eq. (1), which results in:

$$t_0 = -\frac{F}{c}\left\{1 - \left[1 + \left(\frac{d}{F}\left(-\frac{N-1}{2}\right)\right)^2 - 2\sin\theta_s\frac{d}{F}\left(-\frac{N-1}{2}\right)\right]^{1/2}\right\}. \quad \text{Eq. (2)}$$

Substituting Eq. (1) into Eq. (2), we obtain:

$$t_n = \frac{F}{c}\left\{1 - \left[1 + \left(\frac{d}{F}\left(n - \frac{N-1}{2}\right)\right)^2 - \frac{2d}{F}\left(n - \frac{N-1}{2}\right)\sin\theta_s\right]^{1/2}\right\} - \frac{F}{c}\left\{1 - \left[1 + \left(\frac{d}{F}\left(-\frac{N-1}{2}\right)\right)^2 - \frac{2d}{F}\left(-\frac{N-1}{2}\right)\sin\theta_s\right]^{1/2}\right\}.$$

Simplifying, a general solution for the required element focusing delays can be written as:

$$t_n = \frac{F}{c}\left\{\left[1 + \left(\frac{\overline{N}d}{F}\right)^2 + \frac{2\overline{N}d}{F}\sin\theta_s\right]^{1/2} - \left[1 + \left(\frac{(n-\overline{N})d}{F}\right)^2 - \frac{2(n-\overline{N})d}{F}\sin\theta_s\right]^{1/2}\right\},$$

where $\overline{N}=(N-1)/2$, $t_n$ is the required delay for element n where n=0,1, . . . , N−1, d is the center-to-center spacing between elements, F is the focal length from the center of the array, $\theta_s$ is the steering angle from the center of array, N is the total number of elements (even or odd), and c is the wavespeed. This generalized focusing time delay formula is valid for any number of array elements (even or odd). Furthermore, by eliminating the constant $t_0$, the formula guarantees positive time delays which do not have to be larger than necessary.

Figure 7A:
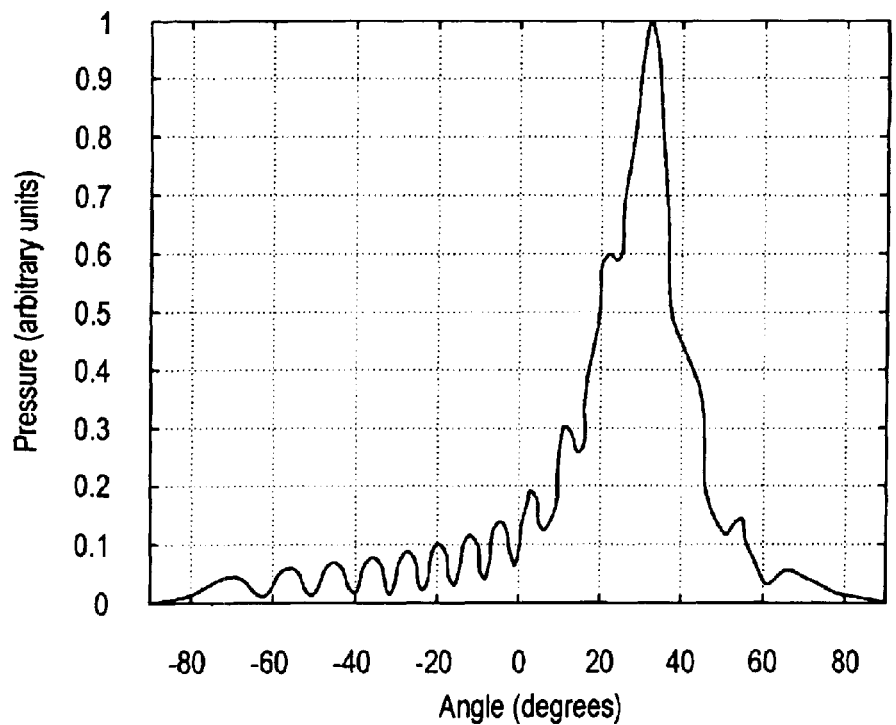
FIG. 7A which shows a pressure versus angle plot generated using a numerical simulation for an N=16 linear array steered in the near field at a steering angle of 30 degrees.
Figure 7B:
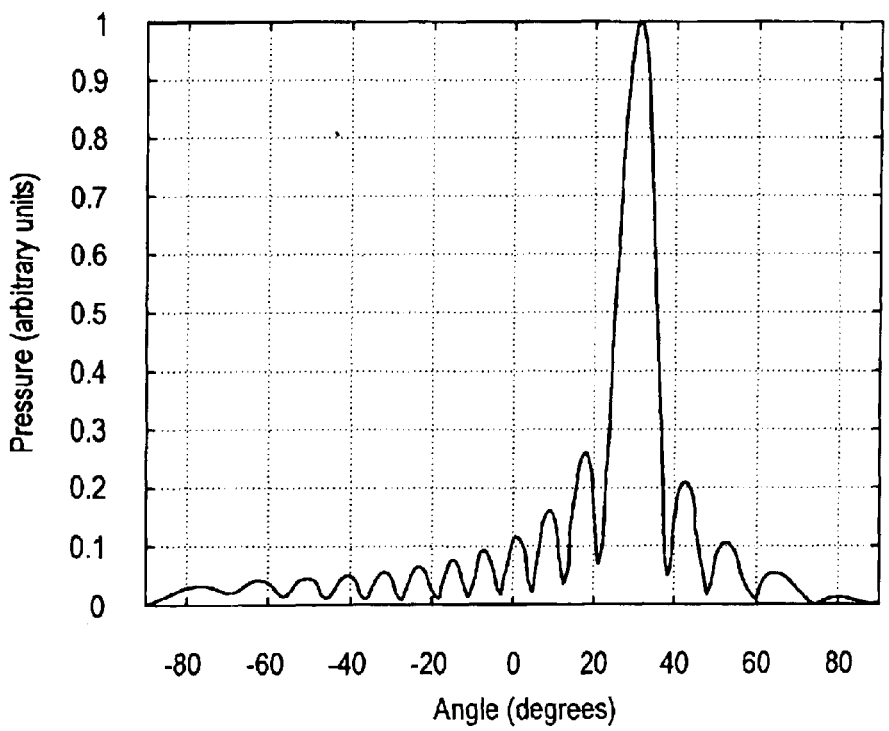
FIG. 7B which shows a pressure versus angle plot generated using a numerical simulation for an N=16 linear array focused in the near field at a focusing angle of 30 degrees.

Focusing to a range beyond a transition range $Z_{TR}$ defined by:

$$Z_{TR} = \frac{D^2}{4\lambda},$$

produces a pressure profile that is similar to steering. In this equation, D is the overall dimension of the array, and λ is the wavelength in the fluid medium. The transition range separates the near field from the far field of the array 28. For target locations within the near field of the array 28, (i.e. at distances less than $Z_{TR}$), focusing may be employed to increase the system resolution. On the other hand, in the far field the directivity of focusing converges to that of steering. For example, FIG. 7A which shows a pressure versus angle plot for an N=16 linear array, d=9.4 mm steered in the near field at a steering angle of 30 degrees. For comparison, FIG. 7B which shows a pressure versus angle plot for an N=16 linear array, d=18.8 mm, focused to a point 0.3 m from the array in the near field at a focusing angle of 30 degrees. Both plots were generated using a numerical simulation and are for 80 kHz ultrasound in a medium wherein the wavespeed is 1500 m/s. Comparing FIG. 7A with FIG. 7B, it can be seen that focusing can be used to produce better directivity in the near field than steering.

Figure 8:
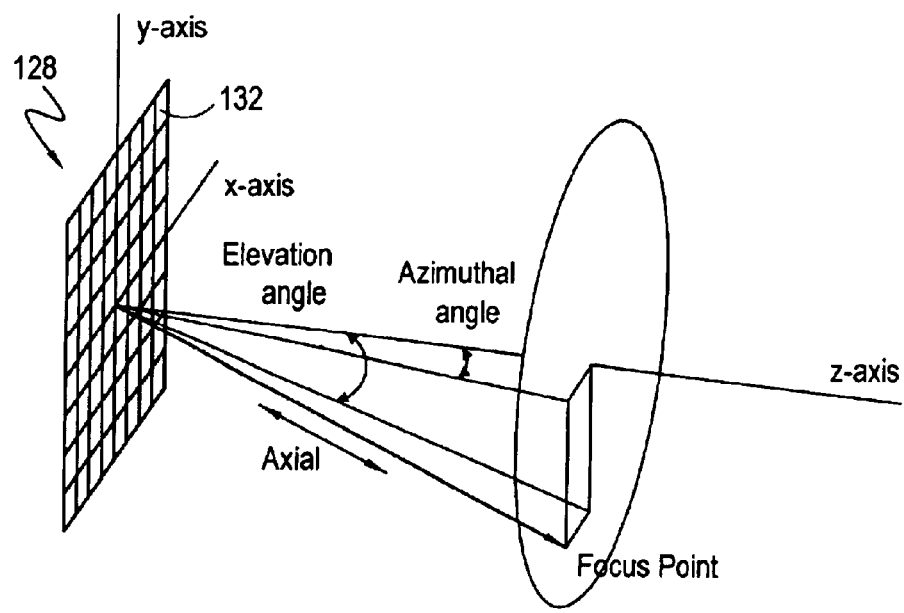
FIG. 8 is a simplified, perspective view of a two-dimensional array of transducer elements and a typical field of view for the two-dimensional array.

The linear array 28 shown in FIG. 2 can be used to produce two-dimensional steering and focusing in the azimuthal direction. Additionally, the elevation angle width can be controlled by modifying the elevation distance (L) of the array 28. Specifically, the larger the elevation distance (L), the narrower the beam will be in the elevation direction. FIG. 8 shows a two-dimensional (matrix) array 128 having transducer elements 132 that can be used in the system 20 to direct ultrasonic energy in both the elevation and azimuthal angles. Although only linear and matrix arrays are shown, it is to be appreciated that other array configurations such as an annular array or irregular array can be used in the system 20 to direct ultrasonic energy and that the formulas disclosed herein can be extended to these two and three dimensional arrays.

With the delay formula now defined, the pressure distribution can be derived in analytical form. For a single element 34, the pressure distribution can be expressed as:

$$p(r, \theta, t) = \frac{p_0}{r} \frac{\sin\frac{ka\sin\theta}{2}}{\frac{k\sin\theta}{2}} \exp\left(-\frac{jka\sin\theta}{2}\right) \exp[j(wt - kr)]$$

According to Huyghens' principle, the pressure distribution of the phased arrays for focusing and steering is the superposition of the pressure of single elements:

$$p(r, \theta, t) = \sum_{n=0}^{N-1} p_n(r, \theta, t)$$

$$= \sum_{n=0}^{N-1} \frac{p_0}{r} \frac{\sin\left(\frac{ka\sin\theta}{2}\right)}{\frac{k\sin\theta}{2}} \exp\left(-\frac{jka\sin\theta}{2}\right) \exp[j(wt_n - kr_n)]$$

$$\approx \sum_{n=0}^{N-1} \frac{p_0}{r} \frac{\sin\left(\frac{ka\sin\theta}{2}\right)}{\frac{k\sin\theta}{2}} \exp\left(-\frac{jka\sin\theta}{2}\right) \exp(j(w(t - \Delta t_n) - k(r - nd\sin\theta)])$$

which leads to the final analytical expression of pressure distribution for beam focusing:

$$p(r, \theta, t) = \frac{p_0 a}{r} \frac{\sin\left(\frac{ka\sin\theta}{2}\right)}{\frac{ka\sin\theta}{2}} \exp\left(-\frac{jka\sin\theta}{2}\right)$$

$$\left(\sum_{n=0}^{N-1} \exp[j(An + Bn^2)]\right) \exp[j(wt - kr)]$$

where:

$$A = \frac{c(N-1)}{2F\tan^2\theta_s}\Delta\tau_0^2 - \omega\Delta\tau_0 + kd\sin\theta$$

$$B = \frac{c\Delta\tau_0^2}{2F\tan^2\theta_s}$$

The final analytical expression of pressure distribution for beam steering is:

$$p(r, \theta, t) = \frac{p_0 a}{r} \frac{\sin\left(\frac{ka\sin\theta}{2}\right)}{\frac{ka\sin\theta}{2}} \exp\left(-\frac{jka\sin\theta}{2}\right)$$

$$\exp[j(\omega t - kr)]\sum_{i=0}^{N-1} \exp[j(-\omega\Delta\tau_0^2 + kd\sin\theta]$$

$$= \frac{p_0 a}{r} \frac{\sin\left(\frac{ka\sin\theta}{2}\right)}{\frac{ka\sin\theta}{2}} \frac{\sin\left[\left(\frac{\omega\Delta\tau_0 - kd\sin\theta}{2}\right)N\right]}{\sin\left(\frac{\omega\Delta\tau_0 - kd\sin\theta}{2}\right)}$$

$$\exp\left[-j\left(\frac{ka\sin\theta}{2}\right)\right] \times$$

$$\exp\left[-j\left(\frac{\omega\Delta\tau_0 - kd\sin\theta}{2}\right)(N-1)\right] \exp[j(\omega t - kr)].$$

Although the pressure distribution for focusing cannot be simplified into closed form, numerical methods can be used to calculate the pressure at any location (r, θ).

Figure 9:
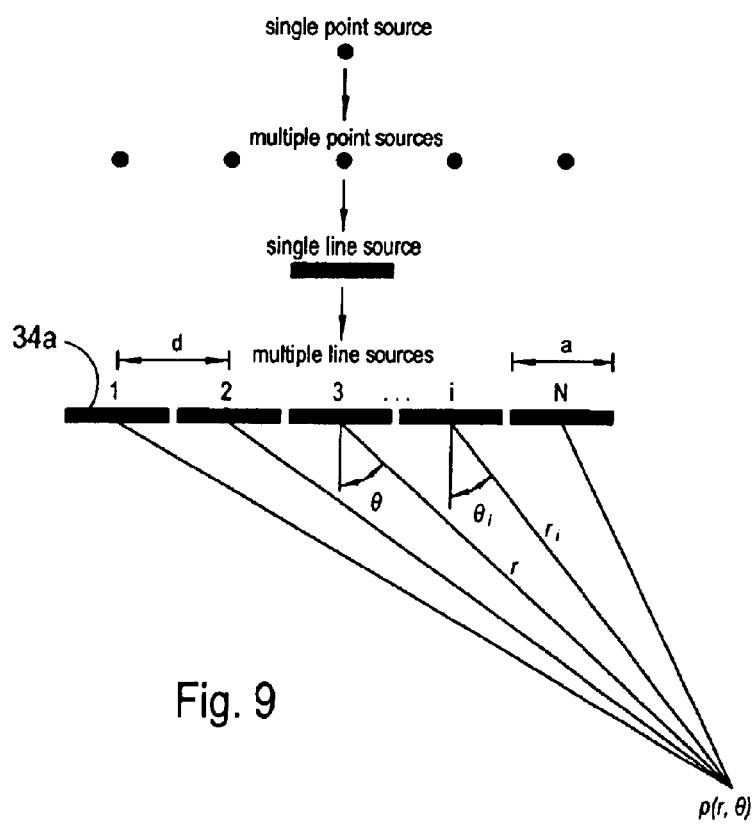
FIG. 9 is a schematic useful in a numerical simulation to determine the phased array pressure distribution wherein the array is modeled as an ensemble of multiple line sources with each source being composed of an infinite number of point sources.

A numerical simulation can be performed based upon Huyghen's principle, which states that wave interactions can be analyzed by summing the phases and amplitudes contributed by a number of simple sources. FIG. 9 demonstrates how the pressure at any given point can then be attained by adding the contributions of a discrete number of simple sources which make up a given element. The contributions of all the elements, each modified by the product of a cosine envelope, are then added up. For focusing including focusing in the near field, the pressure at a given distance from the source can be computed as follows:

$$p(r, \theta, t) = \frac{p_0}{r} \exp[j(\omega t - kr) - \alpha r](\cos\theta)$$

where $p_0$ is the initial pressure (Pa), α is the attenuation coefficient (Np/m) and r is the radial distance from the source (m). Similarly, for steering or focusing in the far field, the pressure at a given distance from the source can be computed as follows:

$$p(r, \theta) = \frac{p_0 a}{j(\lambda)^{\frac{1}{2}}} e^{\frac{2j\pi r}{\lambda}} \frac{\sin\left(\frac{\pi a\sin\theta}{\lambda}\right)}{\left(\frac{\pi a\sin\theta}{\lambda}\right)} \cos\theta$$

OPERATION

The operation of the cleaning system 20 can best be appreciated with initial cross-reference to FIGS. 1 and 6. First, the coordinates of a first location 36 on the surface 38 of the substrate 22 (relative to the array) are identified. In one implementation of the system 20, the coordinates of the first location 36 and other locations requiring cleaning on the surface 38 of the substrate 22 can be determined by analyzing reflected echoes from directed ultrasonic energy generated by the array 28. With the coordinates of the first location 36 known, the computer sub-system calculates the electrical signal parameters $S_N$ (see also FIG. 2) including the voltage, $V_N$, and phase, $\theta_N$, required to obtain a pre-selected (i.e. target) pressure peak at the first location 36 using the mathematical expressions provided above. Alternatively, the signal parameters $S_N$ can be configured to obtain a pre-selected (i.e. target) velocity gradient at the first location wherein the velocity gradient v, can be calculated as follows:

$$v(r, \theta, t) = v_0 + p_0(r, \theta, t)/\rho c$$

where $\rho$ is the density of the fluid medium 26, c is the wavespeed in the fluid medium 26, $v_0$ is the initial velocity state and $\rho_0$ is the initial pressure state. Controlling the velocity gradient can be used to control acoustic streaming including so-called Schlichting streaming. Acoustic streaming facilitates transport of contaminants from the substrate surface and thus enhances cleaning.

The signal parameters can be established to direct (e.g. focus or steer) ultrasonic energy from the array 28 to the first location 36. When the first location is positioned in the near field of the array 28, the signal parameters are typically calculated for focused ultrasonic energy. On the other hand, for a first location 36 that is positioned in the far field of the array 28, focusing or steering can be effectively used.

As shown in FIG. 2, once the parameters have been calculated, each driver 34 generates an electrical signal, $S_N$, which is input to a respective transducer element 34 to drive the respective element 34. Typically, continuous (i.e. non-pulsed) ultrasonic energy is used for a desired period of time until the first location 36 has been cleaned to a sufficient level of cleanliness. However, the system 20 can be used to direct pulsed ultrasonic energy having a preselected duty cycle to clean the first location 36. Note; in some case the voltage of each signal, $V_N$, may not be the same for all elements 34, and in addition, the signal parameters may be calculated to overcome the effect of shadowing (i.e. one or more elements 34 may not be in line of sight with a location on the surface 40 due to the geometry of the substrate 22).

Next, a second location (such as location 40 shown in FIG. 6) which is typically, but not necessarily, adjacent to the first location 36 is cleaned. To clean the second location 40, the computer sub-system 30 acquires the coordinates of the second location 40. These coordinates can be pre-programmed into a database for substrates 22 having known surface geometries, measured using reflected echoes or determined using any other technique known in the pertinent art. With the coordinates of the second location 40, the computer sub-system 30 calculates the electrical signal parameters $S_N$ (see also FIG. 2) including the voltage, $V_N$, and phase, $\theta_N$, required to obtain a pre-selected (i.e. target) pressure peak at the second location 40. Typically, uniform cleaning over a contiguous area is desired. To this end, the signal parameters can be controlled to establish a substantially uniform cavitation energy at a plurality of pre-selected locations on the surface 38 of the substrate 22 (i.e. the target pressure peak is the same for location 36, 40). With the second location cleaned, the above-described process is then repeated for additional location, as desired.

Figure 10A:
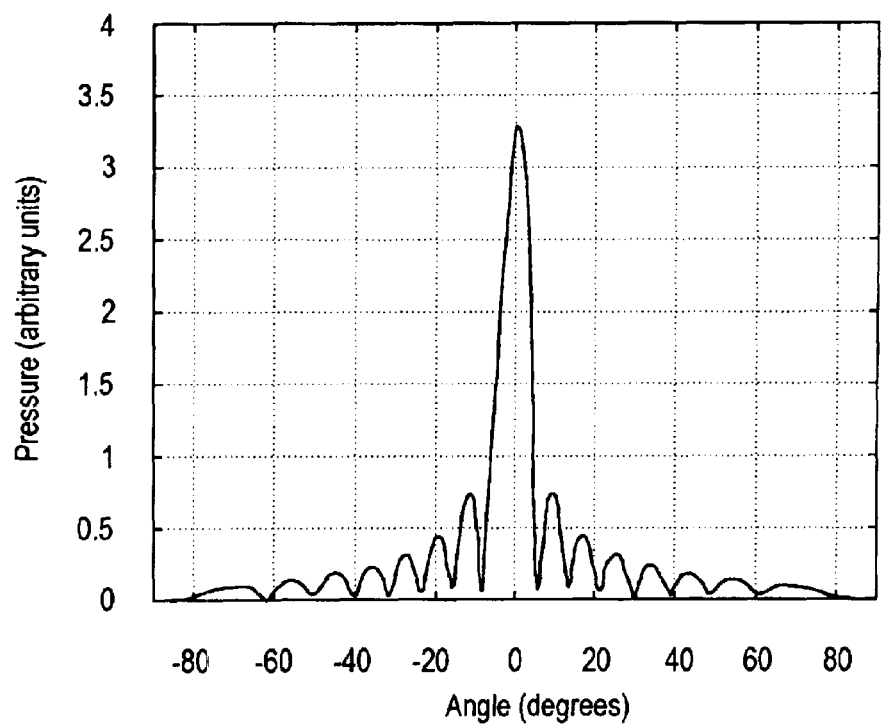
FIGS. 10A–C are plots showing pressure as a function of angle for focused beams directed at 0° with $V_N=1$, 30° with $V_N=1$, and 30° with $V_N=1.3175$, respectively.
Figure 10B:
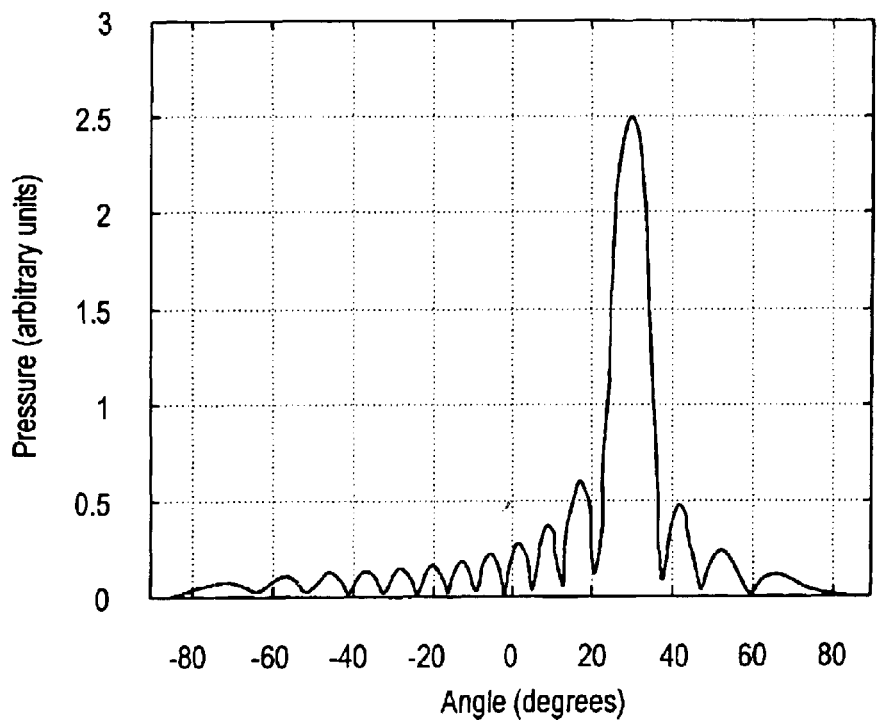
Figure 10C:
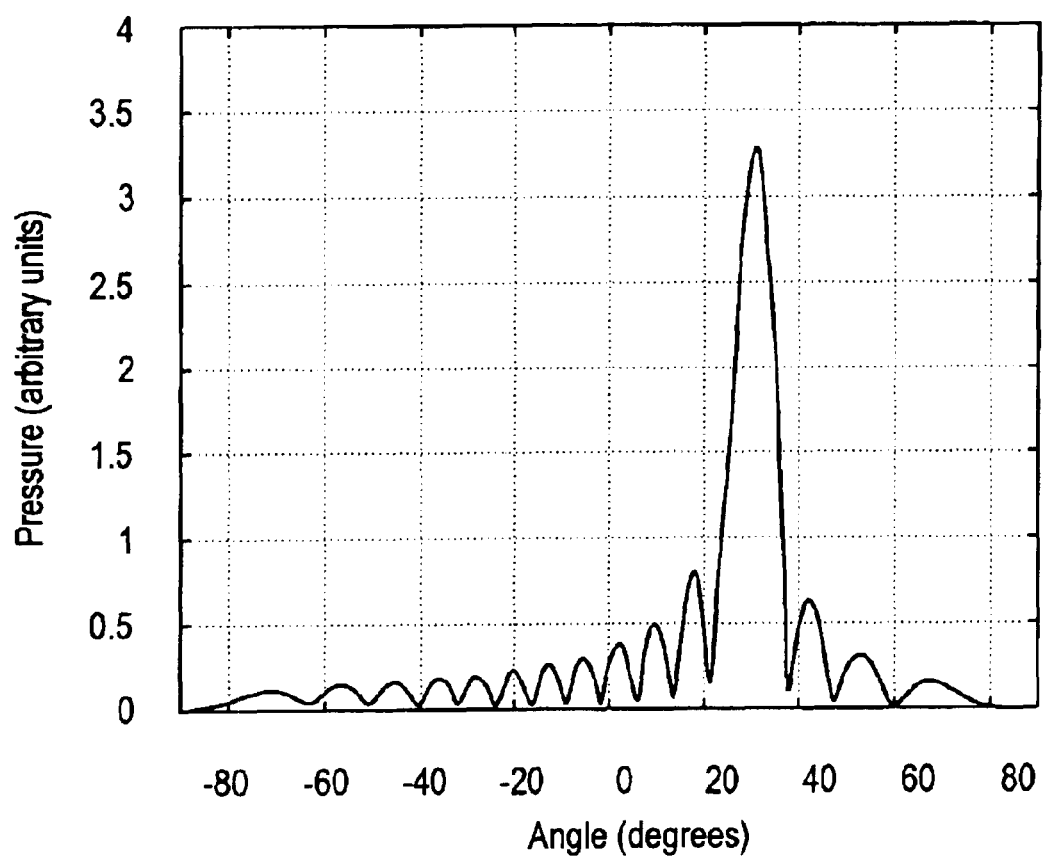

For example, consider the cleaning of locations 36 and 42 shown in FIG. 6. Location 42 is at an angle, $\theta_s$ of zero degrees and a distance of 0.3 m from the array 28 and location 36 is at an angle, $\theta_s$, of thirty degrees and a distance of 0.3464 m from the array 28. FIG. 10A shows the calculated pressure at location 42 for a focused beam wherein all of the elements 34 have an input voltage $V_N$ of one. The result, as shown in FIG. 10A, is a peak pressure of 3.2871 (in arbitrary pressure units). FIG. 10B shows the calculated pressure at location 36 for a focused beam wherein all of the elements 34 have an input voltage $V_N$ of one (i.e. the same input voltage as used to generate FIG. 1A). As shown, the result is a peak pressure of 2.4948 (in arbitrary pressure units) which differs from the peak pressure calculated for location 42. To obtain a peak pressure of 3.2871 at location 36, the equations disclosed above can be used to calculate the required input voltage $V_N$. In this case, input voltage $V_N$=1.3175 is required to obtain a peak pressure of 3.2871 at location 36. Specifically, FIG. 10C shows the calculated pressure at location 36 for a focused beam wherein all of the elements 34 have an input voltage $V_N$=1.3175. Note; calculated pressures shown in FIGS. 10A–C are for an N=16 linear array with d=9.4 mm generating 80 kHz ultrasound in a medium wherein the wavespeed is 1500 m/s.

As shown in FIG. 1, a sensor 42, which can be for example a cavitation meter, a hydrophone or a sonoluminescence probe can be used instead of, or in addition to, the calculation method described above to determine the electrical signal parameters, $S_N$, including the voltage, $V_N$, and phase, $\theta_N$, necessary to obtain a pre-selected (i.e. target) pressure peak at a location (e.g. location 36 shown in FIG. 6) on the surface 38 of the substrate 22. In addition, a standard surface cleanliness test can be performed to ensure that a pre-selected (i.e. target) pressure peak has been obtained.

In another implementation, the phases, $\theta_N$, are calculated to direct ultrasonic energy to a location and a sensor measurement is then made at that location. Next, the measurement is used to adjust array parameters including voltages $V_N$, and phases $\theta_N$ until a desired peak pressure is obtained at the location. Thus, in this implementation, calculations are not used. In yet another implementation, voltages $V_N$, and phases $\theta_N$ are calculated as described above and the sensor 42 is used to verify that the target peak pressure is obtained (i.e. the sensor 42 is used to calibrate the array 42 and computer sub-system 30). If required, the sensor measurements can be used to adjust the voltages $V_N$ until the target peak pressure is obtained.

While the particular systems and methods for ultrasonic cleaning using phased transducer arrays as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A method for cleaning the surface of a substrate, said method comprising the steps of:

arranging a plurality of 'N' transducer elements into an array, each transducer element for propagating a respective ultrasonic wave;

providing a respective electrical signal $S_N$ to each respective transducer element to vibrate each said element, with each said electrical signal $S_N$ having signal parameters including a voltage $V_N$ and phase $\theta_N$;

interposing a fluid medium between said array and the substrate to transmit said ultrasound waves from said array to the substrate; and controlling said signal parameters provided to each said element to direct ultrasonic energy to a first location on the substrate surface and establish a pressure peak at said first location; and altering said signal parameters provided to each said element to direct ultrasonic energy to a second location on the substrate surface and establish a pressure peak at said second location with said pressure peak at said first location being substantially equal to said pressure peak at said second location.

2. A method as recited in claim 1 further comprising the step of determining the coordinates of said first and second location relative to said array and to said coordinates wherein said ultrasonic energy is directed by focusing the ultrasonic waves from each transducer element.

3. A method as recited in claim 2 wherein said arranging step places said first location in the near field of the array.

4. A method as recited in claim 1 wherein said ultrasonic energy is directed by steering the ultrasonic waves from each transducer element.

5. A method as recited in claim 1 wherein said pressure peak is sufficient to cause cavitation bubbles in said fluid.

6. A method as recited in claim 1 wherein said arranging step positions said transducer elements in a linear array.

7. A method as recited in claim 1 wherein said arranging step positions said transducer elements in a two-dimensional planar array.

8. A method for cleaning the surface of a substrate, said method comprising the steps of:

arranging a plurality of 'N' transducer elements into an array, each transducer element for propagating a respective ultrasonic wave;

interposing a fluid medium between said array and the substrate to transmit said ultrasound waves from said array to the substrate;

inputting a respective electrical signal $S_N$ to each respective transducer element to drive each said element and direct ultrasonic energy to a location on the substrate surface, with each said electrical signal $S_N$ having signal parameters including a voltage $V_N$ and phase $\theta_N$;

measuring a property indicative of a peak pressure at said location; and using said property measurement to modify the signal parameters provided to each element and obtain a pre-selected peak pressure at said location.

9. A method as recited in claim 8 wherein said measuring step is accomplished using a sensor selected from the group of sensors consisting of a cavitation meter, a hydrophone and a sonoluminescence probe.

10. A method as recited in claim 8 wherein said measuring step is accomplished using a surface cleanliness test.

11. A method as recited in claim 8 wherein said arranging step positions said transducer elements in an array configuration selected from the group of array configurations consisting of a linear array and a two-dimensional planar array.

12. A method as recited in claim 8 further comprising the step of determining the coordinates of said location by analyzing reflected echoes from directed ultrasonic energy generated by said array.

* * * * *

UNITED STATES PATENT AND TRADEMARK OFFICE
CERTIFICATE OF CORRECTION

PATENT NO. : 6,890,390 B2
DATED : May 10, 2005
INVENTOR(S) : Lawrence Azar

It is certified that error appears in the above-identified patent and that said Letters Patent is hereby corrected as shown below:

Column 1,
Line 6, delete "ultrasonics" insert -- ultrasonic --.

Column 5,
Line 2, delete "(a)" insert -- ($a$) --.
Line 3, delete "(d)" insert -- ($d$) --.
Line 3, delete "(D)" insert -- ($D$) --.
Line 4, delete "(L)" insert -- ($L$) --.
Line 39, delete "Δσ" insert -- Δτ --.

Column 7,
Line 45, delete $$p(r,\theta,t) = \frac{p_0}{r} \frac{\sin\frac{ka\sin\theta}{2}}{\frac{k\sin\theta}{2}} \exp\left(-\frac{jka\sin\theta}{2}\right) \exp[j(wt - kr)]$$

insert $$p(r,\theta,t) = \frac{p_0}{r} \frac{\sin\frac{ka\sin\theta}{2}}{\frac{k\sin\theta}{2}} \exp\left(-\frac{jka\sin\theta}{2}\right) \exp[j(wt - kr)]$$

Column 9,
Line 19, delete "v(r, θ, t) = v$_0$ + ρ$_0$ (r, θ, t) / ρc" insert -- v(r, θ, t) = v$_0$ + p$_0$ (r, θ, t) / ρc --.
Line 22, delete "ρ$_0$" insert -- p$_0$ --.
Line 27, delete "e g." insert -- e.g. --.

UNITED STATES PATENT AND TRADEMARK OFFICE
CERTIFICATE OF CORRECTION

PATENT NO. : 6,890,390 B2
DATED : May 10, 2005
INVENTOR(S) : Lawrence Azar

It is certified that error appears in the above-identified patent and that said Letters Patent is hereby corrected as shown below:

Column 10,
Line 9, delete "1A" insert -- 10A --.

Signed and Sealed this

Sixth Day of September, 2005

JON W. DUDAS
*Director of the United States Patent and Trademark Office*